(12) United States Patent
Siniscalchi

(10) Patent No.: US 6,522,200 B2
(45) Date of Patent: Feb. 18, 2003

(54) PROCESS-INSENSITIVE, HIGHLY-LINEAR CONSTANT TRANSCONDUCTANCE CIRCUIT

(75) Inventor: Patrick P. Siniscalchi, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/734,312

(22) Filed: Dec. 11, 2000

(65) Prior Publication Data

US 2002/0105381 A1 Aug. 8, 2002

(51) Int. Cl.[7] ............................. H03F 3/45; G06G 7/16
(52) U.S. Cl. ...................... 330/254; 330/252; 330/261; 327/356
(58) Field of Search ................................ 330/254, 252, 330/261; 327/356

(56) References Cited

U.S. PATENT DOCUMENTS

| 5,343,097 | A |   | 8/1994 | Takeuchi |
|---|---|---|---|---|
| 5,432,474 | A | * | 7/1995 | Lauffenburger et al. .... 330/110 |
| 5,532,637 | A |   | 7/1996 | Khoury et al. |
| 5,952,867 | A | * | 9/1999 | Choi .......................... 327/346 |
| 6,040,731 | A | * | 3/2000 | Chen et al. ................. 327/307 |

FOREIGN PATENT DOCUMENTS

| DE | 43 29 896 A1 | 3/1995 |
|---|---|---|
| EP | 0 400 650 A2 | 12/1990 |

OTHER PUBLICATIONS

"A CMOS Analog Front–End Circuit for an FDM–Based ADSL System," IEEE Journal of Solid–State Circuits, vol. 30, No. 12, Dec. 1995 (Zhong–Yuan Chang, Damien Macq, D. Haspeslagh, Paul M.P. Spruyt and Bernard L.A.G. Goffart.

* cited by examiner

Primary Examiner—Patricia Nguyen
(74) Attorney, Agent, or Firm—Dana L. Burton; W. James Brady; Frederick J. Telecky, Jr.

(57) ABSTRACT

A process-insensitive, highly-linear, constant transconductance circuit employs a CMOS multiplier in the signal path that is offset biased with a specific combination of currents to compensate for variations in transconductance due to resistor processing variations.

18 Claims, 5 Drawing Sheets

PROCESS-INSENSITIVE, HIGHLY-LINEAR CONSTANT TRANSCONDUCTANCE CIRCUIT

BACKGROUND OF THE INVENTION

1. Field of the Invention

This invention relates generally to transconductance circuits, and more particularly to a technique to control the transconductance of a resistor degenerated transconductance circuit to within a few percent without a tuning loop.

2. Description of the Prior Art

Conventional transconductance circuits have a transconductance value that varies with semiconductor processing. Such circuits often use resistors to achieve high linearization, but typically suffer from a transconductance value that varies as much as +/−25% or even more. These transconductance circuits require extra circuitry in the form of tuning loops to bring the transconductance value with an acceptable range.

Other known solutions for tunable transconductance use CMOS devices operating in the triode region to either degenerate a differential pair or to proportion a variable amount of current generated from a linearized input pair to an output stage. The triode device generally tends to decrease the dc gain of the transconductor and also requires some form of a closed tuning loop to adjust the transconductance to a specific value.

In view of the foregoing, a need exists for a process-insensitive, highly-linear, constant transconductance circuit that does not require extra circuitry in the form of tuning loops to bring the transconductance value with an acceptable range.

SUMMARY OF THE INVENTION

To meet the above and other objectives, the present invention employs a technique to control the transconductance of a resistor degenerated transconductance circuit to within a few percent without a tuning loop. Specifically, a CMOS multiplier is used in the signal path, that is offset biased with a specific combination of currents and which compensates for transconductance variations due to resistor processing variations.

Illustrated in FIG. 1 is a highly-linear, process-insensitive, constant transconductance circuit 100 according to one embodiment of the present invention. The input stage consisting of amplifiers A1 and A2, CMOS transistors M11, M12 and resistor R is well-known in the prior art and yields a transconductance that is highly linear and inversely proportional to resistor processing. An offset biased CMOS multiplier a consisting of devices M3–M6 is used as the cascode portion of a folded cascode stage. The offset is generated by forcing current I1 to be greater than current I2. The overall circuit transconductance is kept constant by implementing currents I1 and I2 such that they are specific combinations of reference currents, one generated by a bandgap voltage and an external resistor and the other generated by a bandgap voltage and an internal resistor, such as illustrated in FIG. 8. The compensating/bias currents are also used to bias the remaining portions of the transconductance circuit. The overall bias current increases with lower resistor processing with the above discussed current I1 and I2 combinations. This aids in preventing the input stage from limiting and causing distortion when the resistor processing is low, and also ensures that less current is dissipated for the same distortion level when the resistor processing is high. The CMOS multiplier is implemented using low threshold voltage devices, allowing additional cascode of low threshold voltage devices to be placed between the CMOS multiplier and the outputs, which has the added advantage of keeping the drain voltages of CMOS devices M3–M6 equal.

In one aspect of the invention, a constant transconductance circuit is implemented with a specifically biased CMOS multiplier to proportion a variable amount of current generated from a linearized input pair to an output stage in which all devices are sustained in the saturation region to keep the dc gain high.

In another aspect of the invention, a constant transconductance circuit is implemented with a CMOS multiplier properly biased to keep the overall transconductance insensitive to resistor process variations and therefore to negate the need for a transconductance tuning loop.

In yet another aspect of the invention, a constant transconductance circuit is implemented with a CMOS multiplier that acts as a cascode to provide high output impedance and hence high dc gain.

In still another aspect of the invention, a constant transconductance circuit is implemented with a CMOS multiplier in which the currents that bias the multiplier can be used to bias the entire transconductance stage, wherein the currents are partially proportional to the internal resistor such that the input stage bias compensates for resistor variation using the least amount of power to keep the total harmonic distortion (THD) constant for a maximum input signal.

In still another aspect of the invention, a constant transconductance circuit is implemented having a highly-linear input stage and provides a process and temperature insensitive, constant transconductance without the need for a closed tuning loop.

In still another aspect of the invention, a constant transconductance circuit is implemented with a CMOS multiplier to proportion the transconductance to the output stage rather than a triode device such that the dc gain is not degraded.

In still another aspect of the invention, a constant transconductance circuit is implemented with a CMOS multiplier in which the sources of the devices in the multiplier provide a low-impedance point that can be connected to multiple input stages sharing a common output stage to reduce power consumption.

As used herein, resistor processing is the variation in resistance that occurs when an integrated circuit (IC) if processed in a wafer fabrication facility in which the resistors in the IC do not have consistent values from either chip to chip or wafer lot to wafer lot. The values of these components will vary due to semiconductor manufacturing process variations. In many semiconductor processes, for example, the polysilicon resistor sheet resistance can vary +/−25%. A 10 kOhm resistor on a chip, therefore, can vary from 7.5 kOhms to 12.5 kOhms due to variations in resistor processing. Resistor processing then, is basically how the resistor values will vary due to slight variations in the manufacturing process. An input stage having a transconductance that is inversely proportional to resistor processing, therefore, means that if the resistors on a chip happen to be processed 25% high (12.5 kOhms using the example above), then the transconductance of that stage will be (1/1.25) or 0.8X low (or −20%).

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 2:
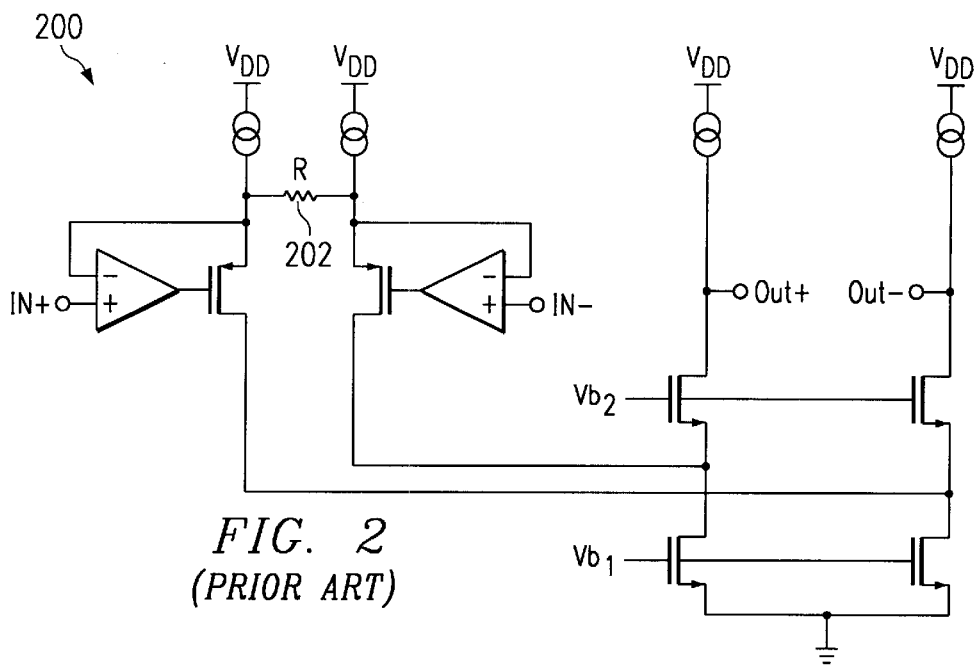
FIG. 2 is a schematic diagram illustrating a transconductance stage in which the overall transconductance is inversely proportional to the degeneration resistor such as known in the prior art.

Looking now at FIG. 2, a schematic diagram illustrates a transconductance stage 200 in which the overall transconductance is inversely proportional to the degeneration resistor 202 such as known in the prior art. The transconductance stage 200 exemplifies one $G_{m/c}$ filtering technique using CMOS processes that has been useful for filtering at frequencies greater than 1 MHz. In CMOS processes using polysilicon resistors, these polysilicon resistors can be used as resistor degeneration for a differential pair such as shown to achieve very good linearity. In order to achieve even higher linearity with large (i.e. IV) input signals, gain stages such as shown can be used to increase the $g_m$ of the input devices so that $$g_{meff} \approx \frac{1}{R}.$$

Further, in order to obtain a high output impedance, necessary for an accurate $G_{m/c}$ filter response with low (i.e. 3V) power supply voltages, a folded-cascode stage, such as shown, is used. The overall transconductance of this stage 200 is inversely proportional to the degeneration resistor 202, and hence suffers from process variations that can be +/−25%, as discussed herein before. Generally, there must be tighter control of the transconductance and some method must be included to trim or vary the transconductance.

Figure 3:
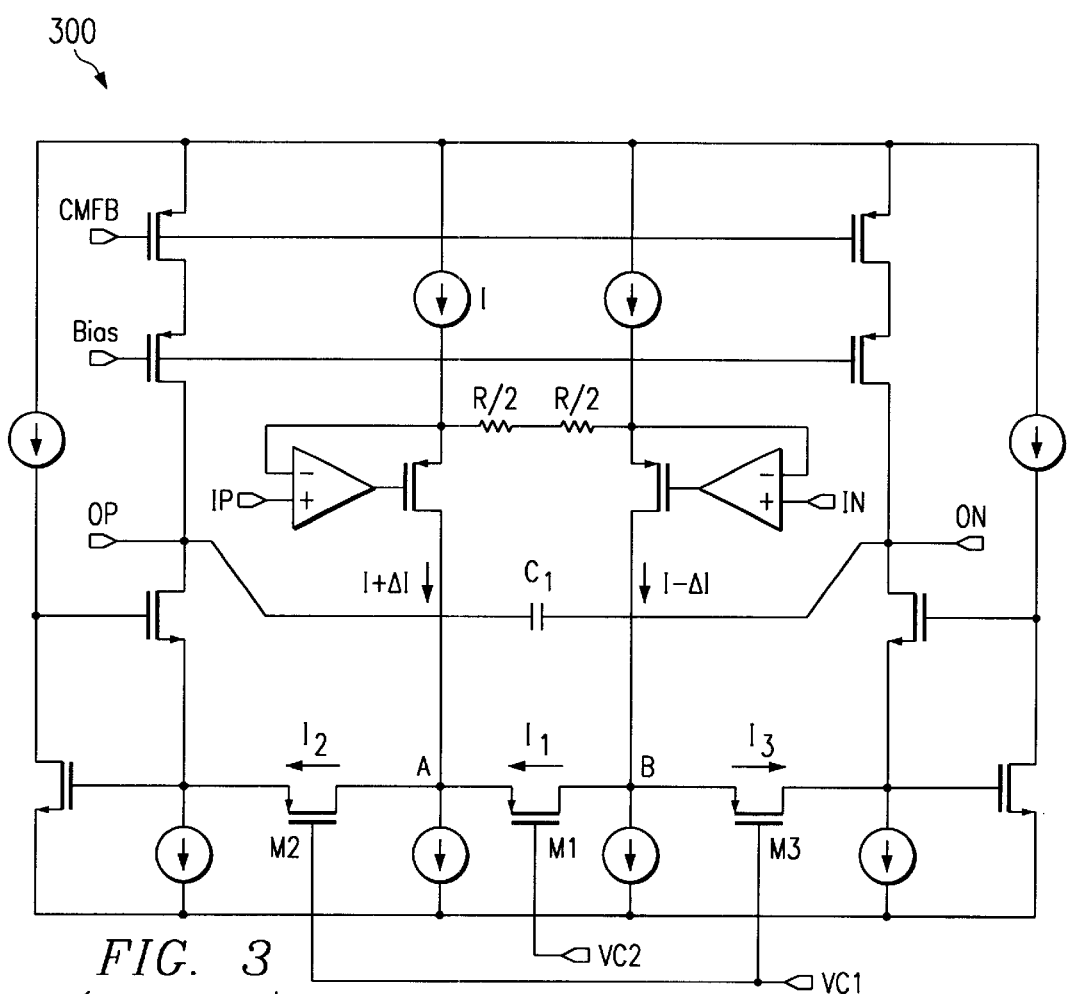
FIG. 3 is a schematic diagram illustrating a transconductance stage, connected with a capacitor as an integrator, in which the overall transconductance is controlled by a tuning loop such as known in the prior art.

FIG. 3 is a schematic diagram illustrating a transconductance stage 300 with a capacitor load in which the overall transconductance is controlled by a tuning loop such as known in the prior art. Specifically, the transconductance is controlled by the voltages VC1 and VC2, which can be provided by a tuning loop or trim circuitry. The transconductance stage 300 is problematic in that it requires additional circuitry to tighten the variation of the transconductance, and significantly lowers the output impedance and hence the low frequency gain of the $G_m$ stage.

Figure 4:
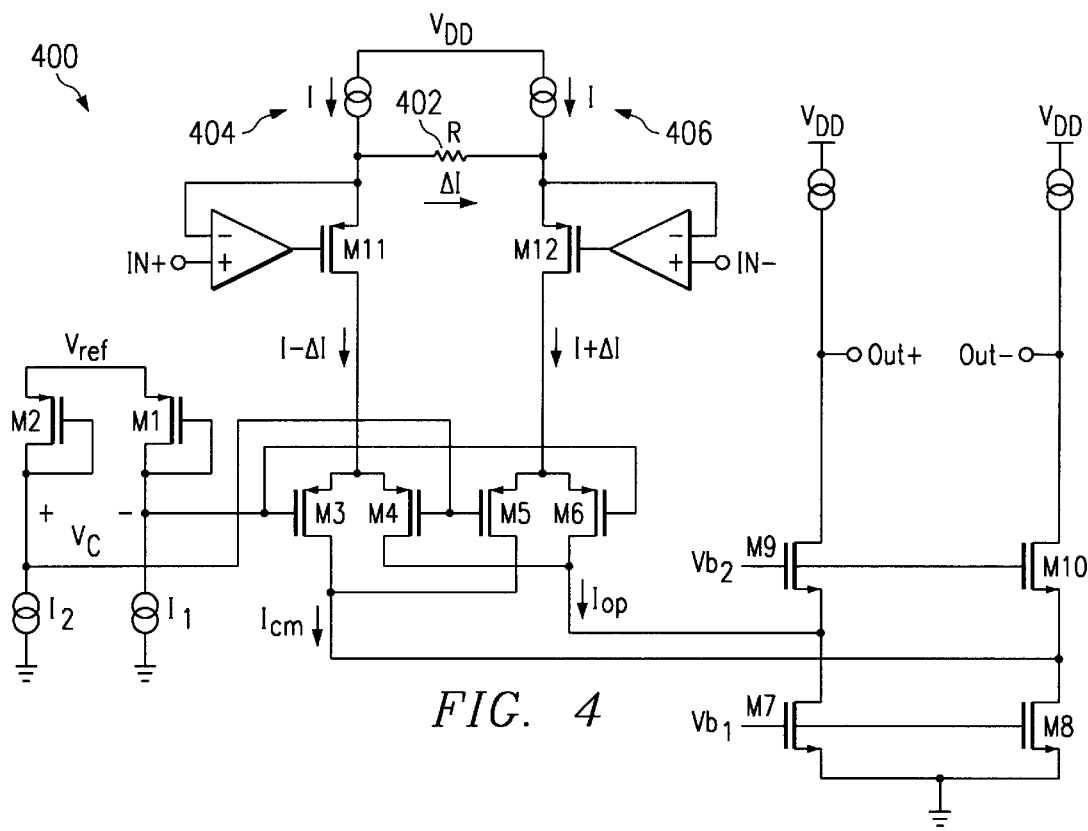
FIG. 4 is a simplified schematic diagram illustrating a transconductance stage capable of controlling the overall transconductance to within a few percent without a tuning loop while keeping the output impedance high according to one embodiment of the present invention.

FIG. 4 is a simplified schematic diagram illustrating a transconductance stage 400 capable of controlling the overall transconductance to within a few percent without a tuning loop while keeping the output impedance high according to one embodiment of the present invention. The transconductance stage 400 employs a CMOS multiplier comprising M3, M4, M5 and M6, that is offset biased so that Vc ≠0V. The selection of $I_1>I_2$ forces this condition. Because of the cross-coupled nature of CMOS transistors M3–M6, this configuration does not waste bias current to the negative power supply, such as generally associated with a simple current steering configuration. This technique lessens the burden of the common-mode feedback circuitry (enumerated 102 in FIG. 1), that is required for most all differential $G_m$ stages. Importantly, with proper selection of $I_1$ and $I_2$ as described herein below, the overall transconductance can be made nearly process variation independent without the need for tuning loops or trimming.

Since $V_{GS1}=V_{GS3}=V_{GS6}$ and $V_{GS2}=V_{GS4}=V_{GS5}$, $$I_{cm} = (I - \Delta I)\left(\frac{I_1}{I_1+I_2}\right) + (I+\Delta I)\left(\frac{I_2}{I_1+I_2}\right) \quad (1)$$

$$= \left(\frac{I_1}{I_1+I_2} + \frac{I_2}{I_1+I_2}\right) + \Delta I\left(\frac{-I_1}{I_1+I_2} + \frac{I_2}{I_1+I_2}\right)$$

$$= I - \Delta I\left(\frac{I_1-I_2}{I_1+I_2}\right)$$

Similarly, $$I_{op} = I + \Delta I\left(\frac{I_1-I_2}{I_1+I_2}\right), \quad (2)$$

and since $$\Delta I \propto \frac{1}{R},$$

the $$\left(\frac{I_1 - I_2}{I_1 + I_2}\right)$$

term must be made proportional to resistor R 402 variations to keep the output current difference $I_1-I_{cm}$, and therefore, the overall transconductance constant. This can be accomplished by implementing $I_1$ and $I_2$ with current components that are fixed and proportional to 1/R as described herein below.

First, offset bias the multiplier M3–M6 by letting $I_1=3I_2$, which makes $$\frac{I_1 - I_2}{I_1 + I_2} = 1/2$$

and the overall transconductance ¼ that of the input stage. The $$\left(\frac{I_1 - I_2}{I_1 + I_2}\right)$$

term can be rewritten as $$\frac{(I_{fix1} - I_{var1}) - (I_{fix2} + I_{var2})}{(I_{fix1} - I_{var1}) + (I_{fix2} + I_{var2})}, \quad (3)$$

where $I_1=I_{fix1}-I_{var1}$ and $I_2=I_{fix2}+I_{var2}$. Under nominal processing conditions, equation (3) equals ½. When the resistor sheet associated with resistor processing discussed herein before is 25% high, the processing factor then is (1.25)X(½) or 0.625. When the resistor sheet is 25% low, the processing factor is (0.75)X(½) or 0.375. These conditions then lead to the following simultaneous equations:

$$R + 25\% \quad \frac{I_{fix1} - (1/1.25)I_{var1} - I_{fix2} - (1/1.25)I_{var2}}{I_{fix1} - (1/1.25)I_{var1} + I_{fix2} + (1/1.25)I_{var2}} = 0.625 \quad (6)$$

$$R - 25\% \quad \frac{I_{fix1} - (1/0.75)I_{var1} - I_{fix2} - (1/0.75)I_{var2}}{I_{fix1} - (1/0.75)I_{var1} + I_{fix2} + (1/0.75)I_{var2}} = 0.375 \quad (7)$$

Solving equations (4)–(7) yields $$I_{fix1}=0.5, \quad (8)$$

$$I_{var1}=-1, \quad (9)$$

$$I_{fix2}=-0.5, \text{ and} \quad (10)$$

$$I_{var2}=1. \quad (11)$$

These currents are relative and appropriate levels could be, for example, 50 µA, −100 µA, −50 µA and 100 µA respectively. Both $I_{var1}$ and $I_{var2}$ are $$\propto 1/R,$$

while $I_{fix1}$ and $I_{fix2}$ are constant.

Figure 5A:
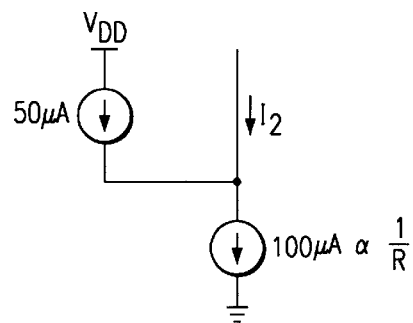
FIGS. 5a and 5b are schematic diagrams illustrating current sourcing techniques suitable for use with the transconductance stage depicted in FIG. 4 according to one embodiment of the present invention.
Figure 5B:
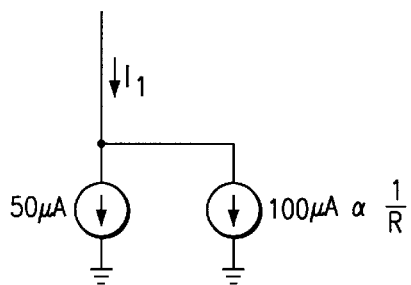

FIGS. 5a and 5b are simplified schematic diagrams illustrating current sourcing architectures suitable for use with the transconductance stage depicted in FIG. 4 according to one embodiment of the present invention. These architectures depict methods for supplying the combination currents represented by equations (4)–(7).

Figure 1:
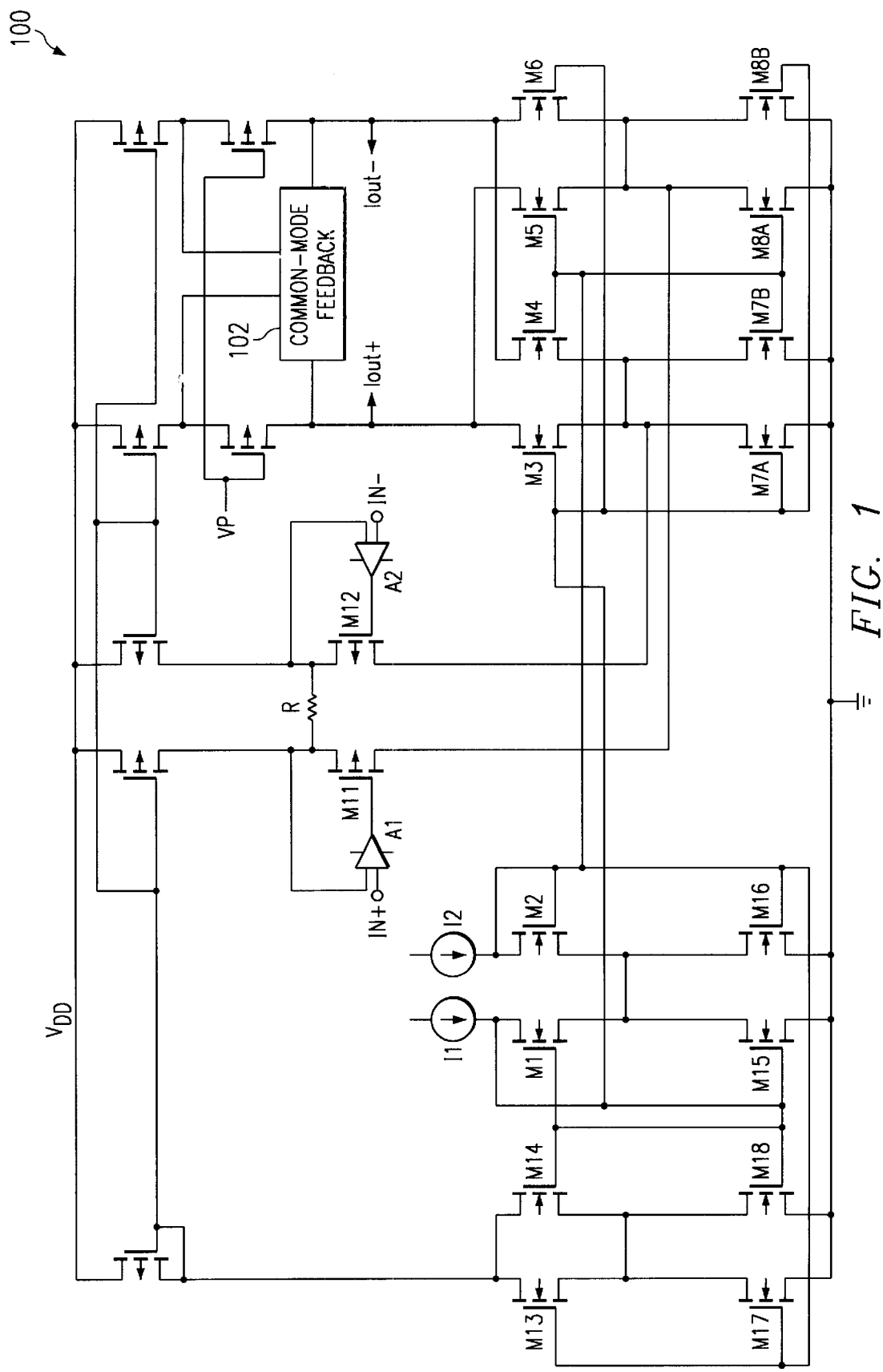
FIG. 1 is a schematic diagram illustrating a highly linear, constant transconductance stage according to one embodiment of the present invention.
Figure 6:
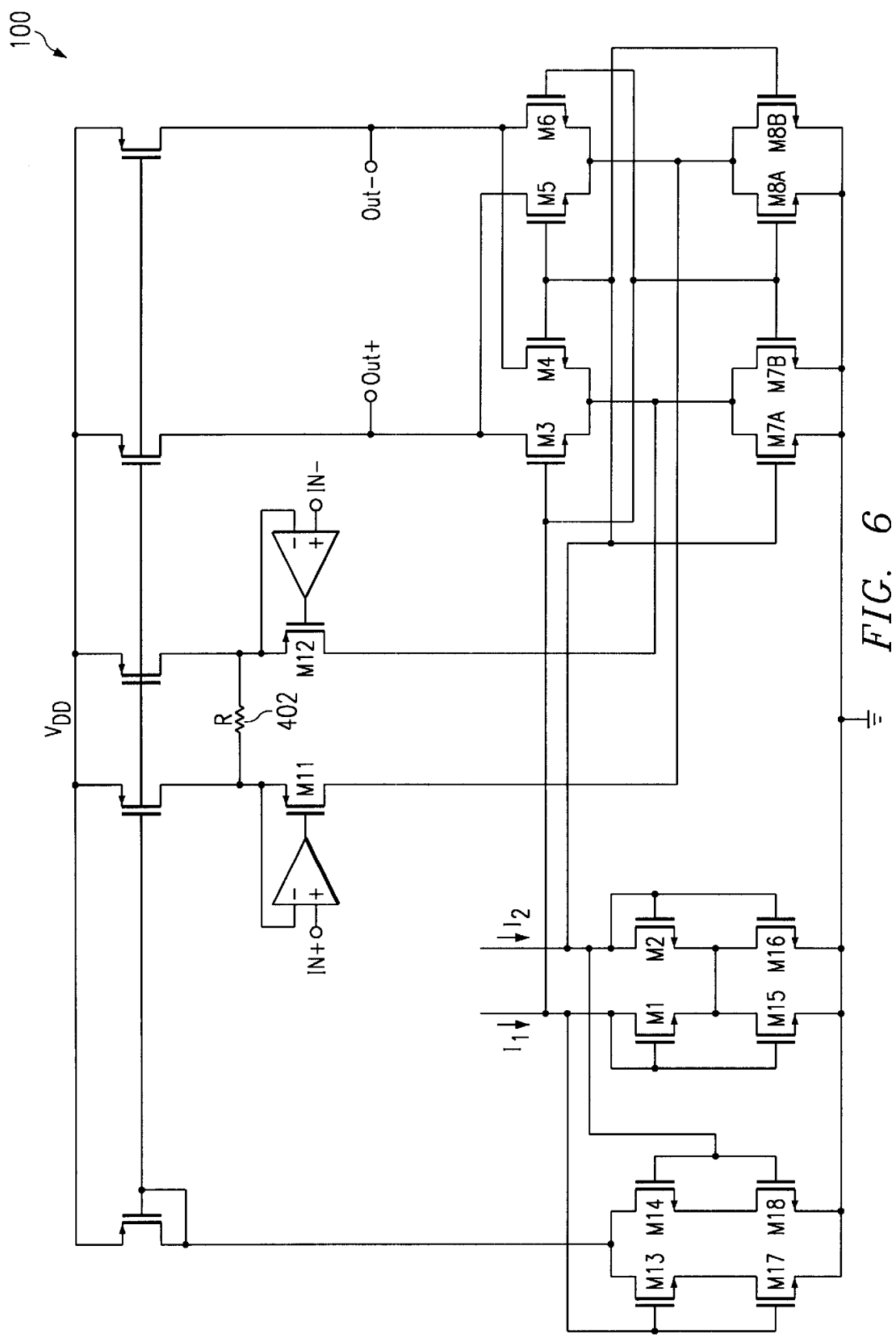
FIG. 6 is a schematic diagram showing a less detailed version of the highly linear, constant transconductance stage depicted in FIG. 1 according to one embodiment of the present invention.

FIG. 6 is a schematic diagram showing a less detailed version of the highly linear, constant transconductance stage 100 depicted in FIG. 1 according to one embodiment of the present invention. The constant transconductance stage 100 has two modifications that provide compactness and improve performance of the $G_m$ stage 400 depicted in FIG. 4. The first includes building the multiplier into the N-channel device cascodes, M9 and M10. The second includes having the bias current I 404, 406 vary with the average of $I_1$ and $I_2$. This provides two benefits. The first benefit is that devices that $I_1$ and $I_2$ feed into and the devices in the multiplier always operate at the same current levels. The second benefit is that the average of $I_1$ and $I_2$ goes up with lower resistor sheet processing $$\left(\propto \frac{1}{R}\right).$$

This aids in keeping the input devices appropriately biased over resistor changes, providing more current when needed so that the signal across R 402 does not go into compression. Most preferably, CMOS devices M1–M6 and M13–M14 are low threshold voltage devices to allow for high output swing at the output. It can be appreciated that a simple cascode could also be used if the output swing is not required to be very large.

Figure 7:
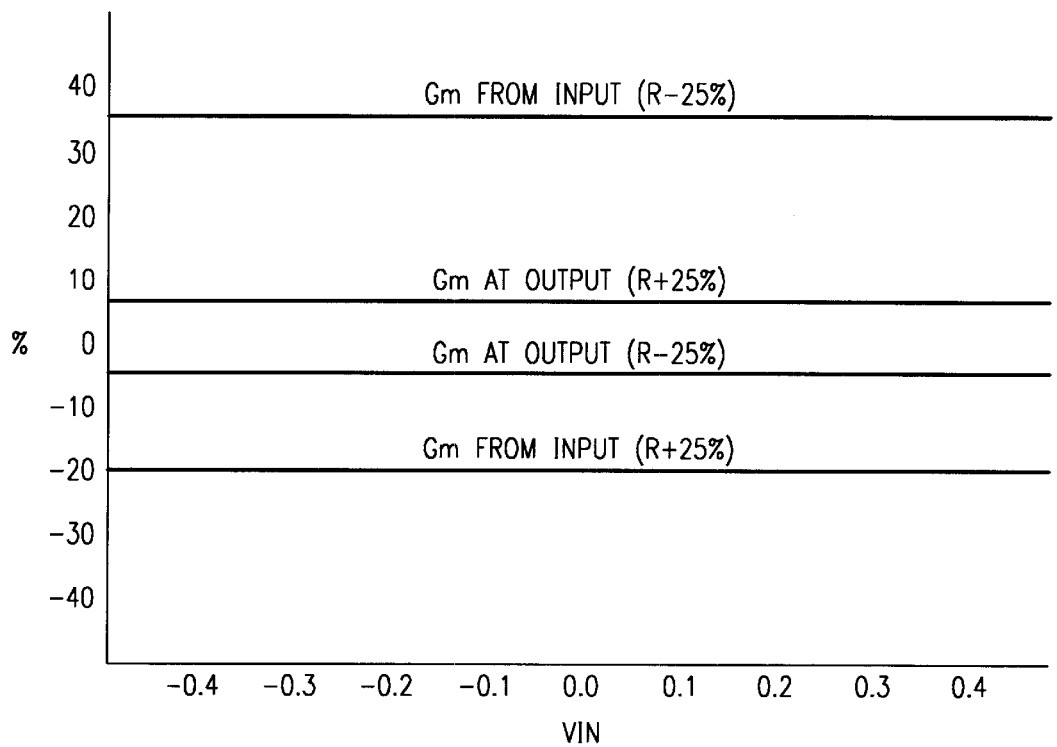
FIG. 7 is graph illustrating simulated variations in the transconductance for the transconductance stage depicted in FIG. 6 in response to variations at the multiplier input portion of the transconductance stage according to one embodiment of the present invention.
Figure 8:
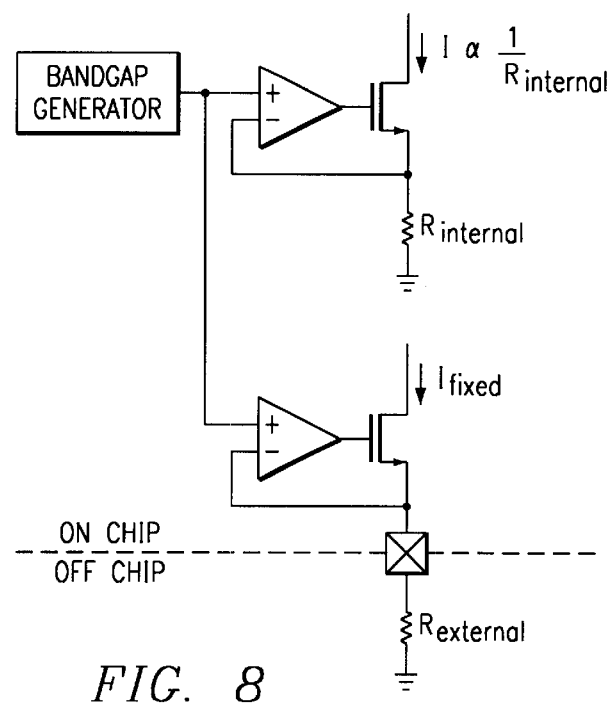
FIG. 8 is a schematic diagram illustrating a technique for generating currents in an embodiment of the present invention.

FIG. 7 is graph illustrating simulated variations in the output transconductance for the transconductance stage 100 depicted in FIG. 6 in response to variations at the multiplier input portion of the transconductance stage according to one embodiment of the present invention. The transconductance variation can be seen to be improved from a wide variation at the multiplier input to a small variation at its output. The variations are simulated results using the ideally calculated currents represented by equations (8)–(11). The present inventor has found that the output transconductance can be made even tighter (<few %), using appropriate modifications of the current components $I_1$ and $I_2$.

In view of the above, it can be seen the present invention presents a significant advancement in the art of transconductance circuit technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types so long as the combinations achieve a process-insensitive, highly-linear, constant transconductance circuit according to the inventive principles set forth herein above. Further, the present invention is not limited to a particular type of transconductance or Gm stage, and can for example, be implemented using transconductance stages other than Gm/C or transconductance-C filters.

What is claimed is:

1. A transconductance circuit comprising:

an output stage;

a resistor degenerated input stage operative to generate a transconductance;

a bias current generator operative to generate a plurality of offset bias currents proportional to resistor processing variations associated with the resistor degenerated input stage; and a multiplier operative in response to a plurality of offset bias currents to proportion the transconductance to the output stage such that the transconductance does not vary with the resistor processing variations, wherein the transconductance circuit is devoid of tuning loops and trimming devices.

2. The transconductance circuit according to claim 1 wherein the resistor degenerated input stage comprises a resistor linearized differential transistor pair.

3. The transconductance circuit according to claim 1 wherein the bias current generator comprises an external resistor and a first bandgap voltage operative to generate a first reference current and further comprises an internal resistor and a second bandgap voltage operative to generate a second reference current, wherein the first and second reference currents function to provide the plurality of bias offset currents.

4. The transconductance circuit according to claim 1 wherein the multiplier comprises a plurality of CMOS devices.

5. The transconductance circuit according to claim 4 wherein the plurality of CMOS devices are implemented as a cascode portion of a folded cascode stage.

6. The transconductance circuit according to claim 4 wherein the CMOS devices comprise low threshold voltage devices.

7. The transconductance circuit according to claim 1 wherein the bias current generator is further operative to provide increased offset bias current levels in response to decreased resistor processing.

8. A transconductance circuit comprising:

an output stage;

means for generating a transconductance that is inversely proportional to resistor processing variations;

means for generating offset bias currents proportional to resistor processing variations; and means for proportioning the transconductance to the output stage in response to the offset bias currents such that the transconductance proportioned to the output stage does not vary with the resistor processing variations.

9. The transconductance circuit according to claim 8 wherein the transconductance circuit is devoid of tuning loops.

10. The transconductance circuit according to claim 8 wherein the transconductance circuit is devoid of trimming devices.

11. The transconductance circuit according to claim 8 wherein the means for generating a transconductance comprises a resistor degenerated differential transistor pair.

12. The transconductance circuit according to claim 8 wherein the means for generating offset bias currents comprises an external resistor and a first bandgap voltage operative to generate a first reference current and further comprises an internal resistor and a second bandgap voltage operative to generate a second reference current.

13. The transconductance circuit according to claim 8 wherein means for generating offset bias currents is operational to generate a first reference current and a second reference current such that the first and second reference currents are comprised of current components that are fixed and proportional to the resistor processing variations.

14. The transconductance circuit according to claim 8 wherein the means for proportioning the transconductance to the output stage comprises a multiplier.

15. The transconductance circuit according to claim 14 wherein the multiplier comprises a plurality of CMOS devices configured as a cascode portion of a folded cascode stage.

16. The transconductance circuit according to claim 8 wherein the means for generating offset bias currents is operative to provide increased offset bias current levels in response to decreased resistor processing variations.

17. A method of generating a transconductance comprising the steps of:

(a) providing an input stage transconductance circuit operative to generate a transconductance value that is inversely proportional to resistor processing variations;

(b) providing an offset biased multiplier;

(c) providing a current generator;

(d) generating via the current generator, offset bias current components that are fixed and inversely proportional to the resistor processing variations; and (e) biasing the offset biased multiplier via the offset bias current components such that the offset biased multiplier can generate a proportioned transconductance that compensates for the inversely proportional transconductance generated by the input stage transconductance circuit.

18. The method according to claim 17 wherein the step of generating offset bias current components comprises generating a first reference current and a second reference current that are fixed and proportional to the resistor processing variations.

* * * * *